United States Patent [19]
Jeong et al.

[11] Patent Number: 5,733,690
[45] Date of Patent: Mar. 31, 1998

[54] RETICLE FOR FABRICATING SEMICONDUCTOR DEVICE

[75] Inventors: Seong-kil Jeong, Pyongtaek; Moon-koog Song, Suwon; Jeong-yeal Kim, Suwon; Choung-hee Kim, Suwon, all of Rep. of Korea

[73] Assignee: Samsung Electronics Co., Ltd., Suwon, Rep. of Korea

[21] Appl. No.: 633,904

[22] Filed: Apr. 17, 1996

[30] Foreign Application Priority Data

Oct. 5, 1995 [KR] Rep. of Korea .................. 95-34169

[51] Int. Cl.⁶ ........................................... G03F 9/00
[52] U.S. Cl. ................................... 430/5; 430/22
[58] Field of Search ................. 430/5, 22; 356/400, 356/401

[56] References Cited

U.S. PATENT DOCUMENTS 5,498,500  3/1996  Bae ................................. 430/22

*Primary Examiner*—S. Rosasco
*Attorney, Agent, or Firm*—IP Group of Pillsbury Madison & Sutro LLP

[57] ABSTRACT

A reticle for fabricating a semiconductor device, wherein alignment-marks useful to examine a pattern mistake are formed upon a scribe line, the alignment-marks having pairs of adjoining primary and secondary measurement patterns. Each primary measurement pattern includes a rectangular pattern provided on a rectangular plate, and a rod-shaped pattern separately formed along the sides of the rectangular pattern. Each secondary measure pattern is fitted into the rectangular pattern of the respective primary measure pattern in case that the secondary measure pattern is overlapped with the primary measure pattern, to thereby permit the examination of position of the secondary measurement pattern relative to the primary measurement pattern.

4 Claims, 4 Drawing Sheets

RETICLE FOR FABRICATING SEMICONDUCTOR DEVICE

BACKGROUND OF THE INVENTION

The invention relates to a reticle used in fabricating a semiconductor device, and particularly to a reticle having an alignment-mark useful for examining an alignment mistake between reticles, used in a first step of a photo-etching process for forming an element on a semiconductor wafer.

In a semiconductor fabrication process, a reticle or a mask is used for a pattern transfer device. The mask is a pattern transfer equipment including a pattern image which can be transferred on the overall surface of a wafer or on another mask through once exposure. The reticle is a pattern transfer equipment including a pattern image to be transferred for the purpose of exposing the overall surface of a substrate in a step and repeatable way. Such a reticle is used to print a pattern image on the mask or to transfer the image directly onto a wafer from a step and repeat aligner (stepper).

However, in case the pattern image is directly transferred onto the wafer in the step and repeat method as described above, there occurs a problem that the pattern is reduced or rotated because the first exposing process (hereinafter referred to as the first step) has no standard pattern for the alignment of pattern.

FIGS. 1A to 1C show some problems which may occur in the first step of patterning on a semiconductor wafer.

FIG. 1A illustrates a case in which pattern 1 exposed on the wafer and shown in the solid line is, so as to be smaller than a previously designed actual pattern 2 indicated by the dotted line. On the contrary, FIG. 1B illustrates a case in which the pattern 1 exposed on the wafer is enlarged, so as to be larger than the previously designed actual pattern 2. FIG. 1C illustrate a case in which the exposed pattern 1 is rotated by a predetermined angle on the center of the reticle pattern, compared with the actual pattern 2. In addition, though not illustrated, there is a case in which the reduction and rotation may occur simultaneously.

Therefore, to solve the problem generated in the first exposing process of semiconductor device fabrication, a pattern for an alignment-mark, or a key, which becomes a basis for the pattern alignment in a subsequent exposing process, is formed on the reticle used in the first step and on a scribe line provided around a device-formed area.

FIG. 2 is a schematic view of a conventional reticle for the first step, having an alignment-mark provided on the scribe line. On the center of the reticle 10, a device-formed area 12 having an effective chip pattern is formed. The scribe line to be cut in the cutting process for chip formation is formed around the area. On the other hand, alignment-marks X1 and Y1 formed on the scribe line in the Y direction of FIG. 2 function as the primary measure vernier, and alignment-marks X2 and Y2 formed on the scribe line in the X direction function as the secondary measure vernier. That is, when the wafer is exposed using the reticle 10 for the first step in the method of step and repeat while the scribe lines are overlapped with each other, the pattern is formed with the alignment-marks X1 and X2 and the alignment-marks Y1 and Y2 being superposed with each other. The rotation of the reticle is detected by examining the superposed portion of the primary and secondary patterns with a microscope.

However, with the conventional reticle, only a case in which the rotation of the reticle is of high degree can be detected. Reduction or enlargement of the pattern is undetectable. Accordingly, in a production process in which there is a high density of semiconductor devices formed together on one wafer, even a slight pattern mistake can sharply increase poor devices due to the reduction of design rule.

SUMMARY OF THE INVENTION

An object of the invention is to solve the problem of prior art and to provide a reticle for fabricating a semiconductor this reticle, having an alignment-mark useful in accurately checking out an alignment mistake between the reticles in the first step.

To accomplish the object of the present invention, there is provided a reticle for fabricating a semiconductor device wherein an alignment-mark to examine a pattern mistake is formed upon a scribe line, the alignment-mark having pairs of adjoining primary and secondary measurement patterns; the primary measurement pattern having a rectangular pattern on a rectangular plate and a rod-shaped pattern separately formed along the sides of the rectangular pattern, the secondary measurement pattern being fitted into the rectangular pattern of the primary measurement pattern in case that the secondary measurement pattern is overlapped with the primary measurement pattern, to thereby examine the relative position of the secondary measurement pattern to the primary measurement pattern.

It is desirable that more than two pairs of alignment-marks be formed on each scribe line in the X and Y directions of the reticle. The align-marks are formed around the corners of the rectangular pattern of a device-formed area of the reticle.

DETAILED DESCRIPTION OF THE PREFERRED EMBODIMENT

Figure 1A:
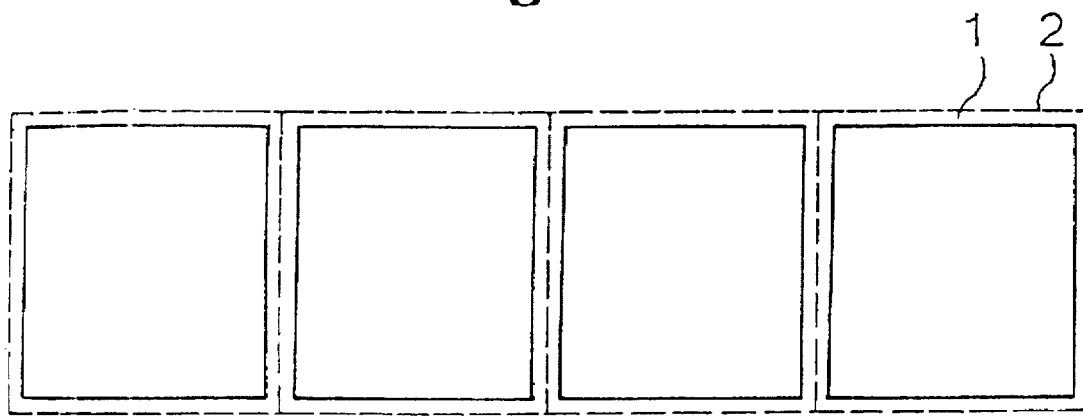
FIGS. 1A to 1C show some problems which may occur in the first step of patterning on the wafer in a semiconductor chip-manufacturing process.
Figure 1B:
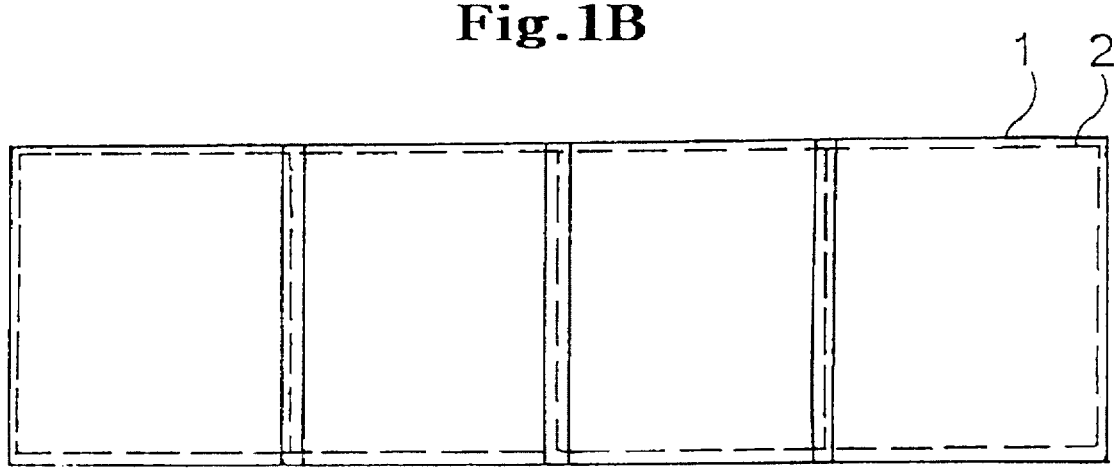
Figure 1C:
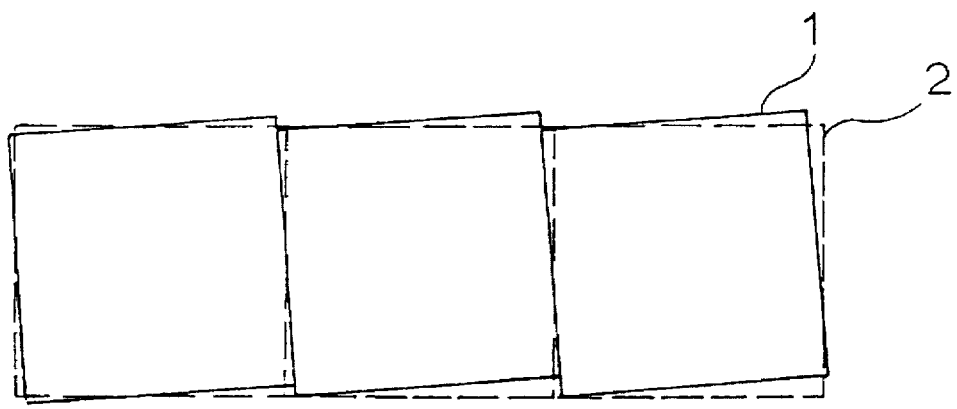
Figure 2:
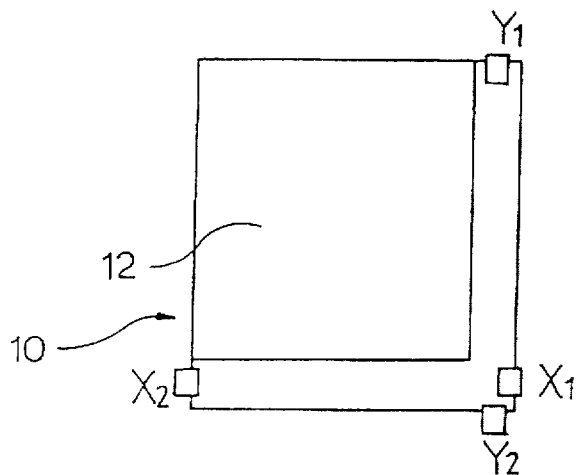
FIG. 2 illustrates an arrangement of an alignment-mark of the reticle used for the first step of a conventional semiconductor fabrication process.
Figure 3:
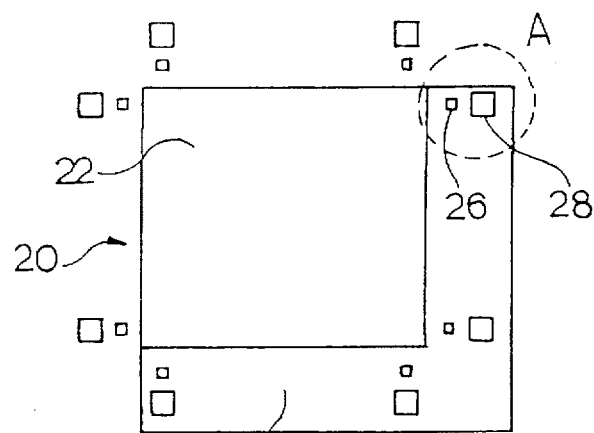
FIG. 3 illustrates an arrangement of alignment-marks the reticle used for the first step of a semiconductor fabrication process according to the first embodiment of the invention.

As illustrated in FIG. 3, on the center of the reticle 20, a rectangular device-formed area 22 having an effective pattern image of a chip is formed, and a scribe line (region) 24 is formed around the device-formed area 22, to be discarded by a cutting process. In the respective scribe lines (regions) 24 of the horizontal direction X and the vertical direction Y of the reticle, two alignment-marks, including a pair of the primary measurement patterns 28 and a pair of the secondary measurement patterns 26 are formed on the corners of the rectangular device-formed area 22.

Figure 4:
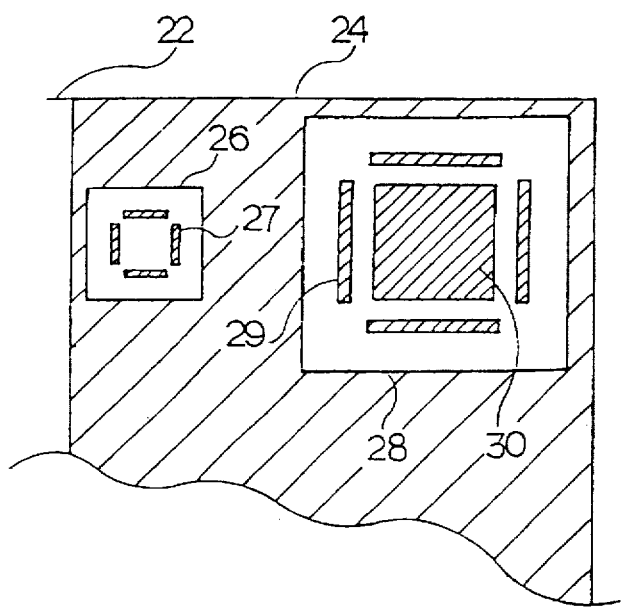
FIG. 4 is an enlarged view of region A of FIG. 3.

As illustrated in FIG. 4, each primary measurement pattern formed in the scribe line 24 has a rectangular pattern 30 in its center, and four first rod-shaped patterns 29 separately formed around the rectangular pattern 30 and corresponding to the respective sides thereof. The four rod-shaped patterns 29 can be formed as a single body.

The secondary measurement pattern 26 shown provided adjacent to the primary measurement pattern 28 in FIG. 4 has four second rod-shaped patterns 27 of the same type as but smaller than four first rod-shaped patterns 29. The second rod-shaped patterns 27 are set to fit into a respective rectangular pattern 30 of a respective primary measurement pattern 28, when exposed while overlapped with the adjacent reticle in the step and repeat exposing process. The secondary measurement pattern 26 should be one quarter the size of the rectangular pattern 30 for correction of the pattern mistake.

As illustrated in FIG. 4, the primary measurement patterns 28 and the secondary measurement patterns 26 are made of a photo-resist layer, and are illustrated as hatched parts in the drawing. Additionally, the secondary patterns need not be rod-shaped. It is sufficient that the shape of the secondary pattern indicates the relative position to the primary measurement pattern 28.

Figure 5:
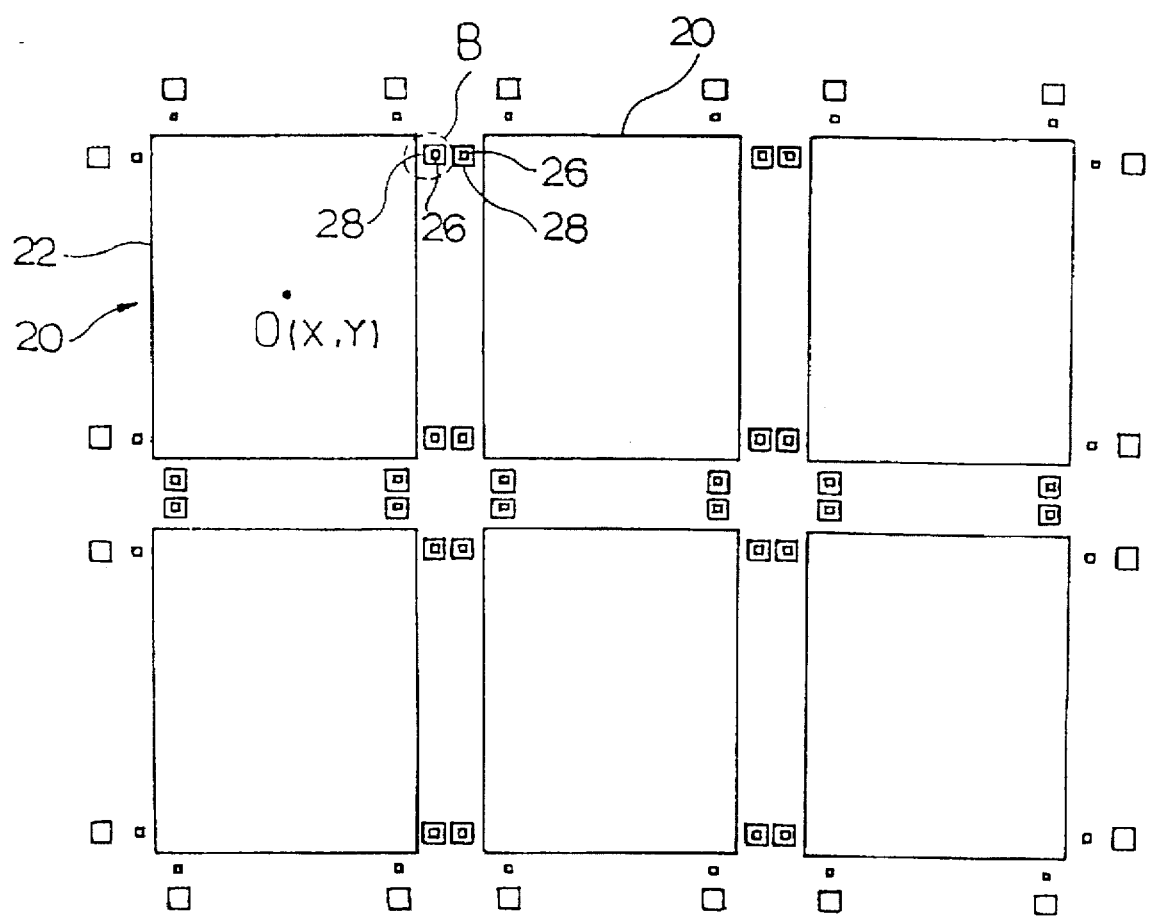
FIG. 5 illustrates the arrangement of alignment-marks when the reticle of FIG. 3 is exposed on a wafer.

As illustrated in FIG. 5, the primary measurement pattern 28 and the secondary measurement pattern 26 of reticle 20 are overlapped with those of a nearby reticle. However, the primary measurement pattern of reticle 20 is overlapped with the secondary measurement pattern of the nearby reticle. The secondary measurement pattern of reticle 20 is overlapped with the primary measurement pattern of the nearby reticle.

Figure 6A:
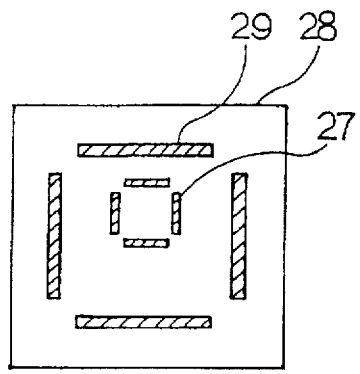
FIGS. 6A to 6F schematically illustrate examples of several pattern mistakes occurring in region B of FIG. 5.
Figure 6B:
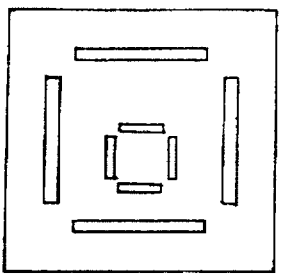
Figure 6C:
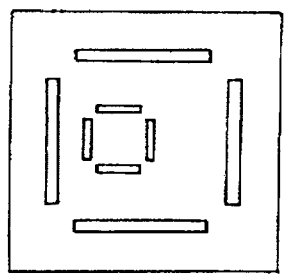
Figure 6D:
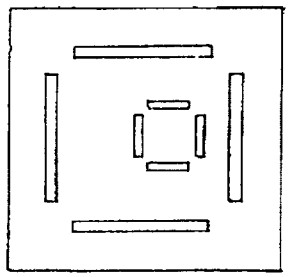
Figure 6E:
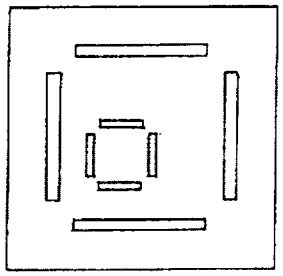
Figure 6F:
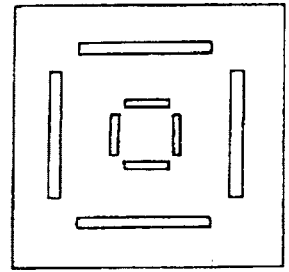

FIGS. 6A to 6F illustrate examples of several pattern mistakes occurring in region B of FIG. 5. The center point O(X, Y) of the device-formed area 22 of the reticle placed on the left side of FIG. 5 is set as a reference point (0, 0). FIGS. 6A and 6B illustrate the rotation in an opposite direction, by shifting up and down the primary measure pattern and the secondary measure pattern. FIGS. 6C and 6D illustrate the reduction in an opposite direction, by shifting left and right the primary and secondary measurement patterns. FIG. 6E illustrates a case in which reduction and rotation occur simultaneously. FIG. 6F illustrates a case in which there is no pattern mistake and the second rod-shaped pattern 27 of the secondary measurement pattern is positioned at the center of the first rod-shaped pattern 29 of the primary measurement pattern.

Figure 7:
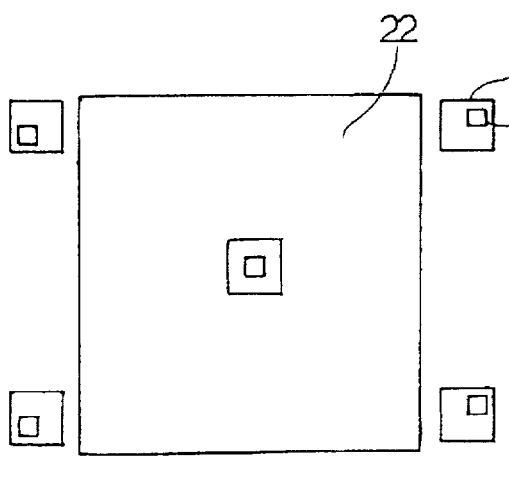
FIG. 7 illustrates an example of checking out a predetermined pattern mistake with alignment-marks in the X direction.
Figure 8:
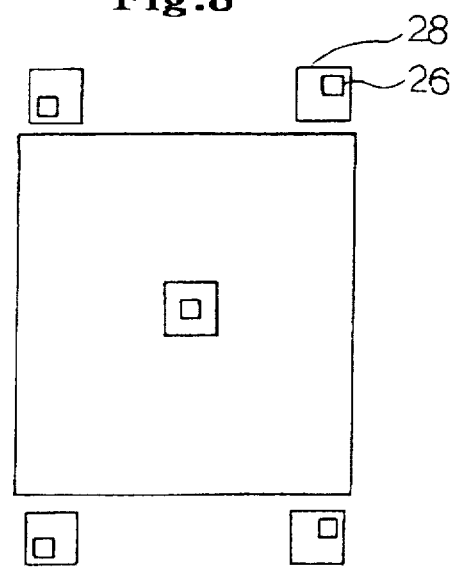
FIG. 8 illustrates an example of checking out a predetermined pattern mistake with alignment-marks in the Y direction.

FIGS. 7 and 8 illustrate examples of checking out a pattern mistake, using an overlay equipment in case that reduction and rotation are each 5 PPM: FIG. 7 illustrates a certain pattern mistake examined with an alignment-mark in the X-direction; FIG. 8 illustrates a certain pattern mistake examined with an alignment-mark in the Y-direction.

In FIG. 7, the examined results are: the reduction in the X-direction is 10 PPM and that in the Y-direction is 0 PPM; the rotation in the X-direction is 0 PPM and that in the Y-direction is 10 PPM. In FIG. 8, the reduction in the X-direction is 0 PPM and that in the Y-direction is 10 PPM; the rotation in the X-direction is 10 PPM and that in the Y-direction is 0 PPM.

It is noted that the values of reduction and rotation can be detected in any of the directions X and Y from the monitored data. The reason why the monitored value is 10 PPM though the values of reduction and rotation are 5 PPM is that the pattern mistake between the shots of the reticle in the first step process is changeable simultaneously in both directions. In order to calculate the compensation value, the sum of the monitored values of the X-direction and Y-direction is divided in half. The compensation value minimizes the pattern mistake while the results are input to the stepper in order to reset the set values.

As described above, in the preferred embodiment of the invention, a pattern mistake can be easily and correctly detected by forming the alignment-marks more precisely and rationally in the reticle used in the first step process. Accordingly, the quality and yield of products are improved by reducing the pattern mistakes of the semiconductor device.

Though the detailed description of the present invention is limited to that of the preferred embodiment of the invention, the invention can be widely applied with variation and modification in scope of this invention.

What is claimed is:

1. A reticle for fabricating a semiconductor device on a wafer, having at least one region which is a device-forming area, and an area adjoining the device-forming area at a scribe line, said reticle, comprising:

at least one set of alignment-marks provided on said adjoining area, each said set including a primary measuring pattern juxtaposed in relation to a secondary measuring pattern;

each primary measuring pattern including a rectangular pattern bounded by four sides, and a rod-pattern including four rod portions each spacedly bordering a respective side of said rectangular pattern;

each secondary pattern being sized and shaped to fit entirely within the rectangular pattern of a respective primary measuring pattern when centrally superimposed thereon.

2. The reticle of claim 1, wherein said at least one pair of alignment-marks is constituted by at least three pairs of said alignment marks arranged in an array having both an extent in an X-direction, and an extent in a Y-direction, which is orthogonal to said X-direction.

3. The reticle of claim 2, wherein said device-forming area is rectangular, and arranged so as to have at least three corners bordering said adjacent area, and said three pairs of alignment-marks are located adjacent respective ones of said three corners.

4. The reticle of claim 1, wherein each said secondary measurement pattern also includes a rectangular pattern bounded by four sides, and a rod pattern including four rod portions each spacedly bordering a respective side of said rectangular pattern of said secondary measurement pattern, each secondary measurement pattern being a reduced size replica of the respective said primary measurement pattern.

* * * * *